(12) United States Patent
Ghis et al.

(10) Patent No.: US 6,954,087 B2
(45) Date of Patent: Oct. 11, 2005

(54) SAMPLING DEVICE FOR A HIGH FREQUENCY ELECTRICAL SIGNAL

(75) Inventors: Anne Ghis, St Martin d'Héres (FR); Patrice Ouvrier-Buffet, Saint Jorioz (FR); Nathalie Rolland, Villeneuve d'Ascq (FR); Aziz Benlarbi-Delai, Villeneuve d'Ascq (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/477,575

(22) PCT Filed: May 13, 2002

(86) PCT No.: PCT/FR02/01597

§ 371 (c)(1),
(2), (4) Date: Nov. 12, 2003

(87) PCT Pub. No.: WO02/093182

PCT Pub. Date: Nov. 21, 2002

(65) Prior Publication Data

US 2004/0145391 A1 Jul. 29, 2004

(30) Foreign Application Priority Data

May 15, 2001  (FR) .............................................. 01 06365

(51) Int. Cl.⁷ ............................ H03K 17/00; H03K 5/00
(52) U.S. Cl. ........................................... 327/94; 327/96

(58) Field of Search ...................... 327/91–97; 341/122, 341/161

(56) References Cited

U.S. PATENT DOCUMENTS

| 4,825,103 | A | | 4/1989 | Hornak ........................ 307/353 |
| 5,471,162 | A | * | 11/1995 | McEwan ...................... 327/92 |
| 5,481,212 | A | * | 1/1996 | Shima .......................... 327/94 |
| 6,654,469 | B1 | * | 11/2003 | Nelson et al. ............. 381/94.1 |
| 2002/0167343 | A1 | * | 11/2002 | Erhart et al. .................. 327/94 |

FOREIGN PATENT DOCUMENTS

| EP | 522578 | * | 1/1993 | |
| FR | 2 764 070 | | 12/1998 | ........... G01R/29/02 |
| GB | 2 157 519 | | 10/1985 | .......... H03K/17/00 |
| JP | 5-182489 | * | 7/1993 | |

* cited by examiner

Primary Examiner—Tuan T. Lam
(74) Attorney, Agent, or Firm—Thelen Reid & Priest LLP

(57) ABSTRACT

A sampling device for high frequency signal that propagates in a propagation structure. The device comprises a first stage (A1, I1, C1) to sample a first signal at a first time t1 and at least one second stage (A2, I2, C2) in series with the first stage to take a second sample representative of the first sample, starting from the first sample, taken at a second time t2 greater than t1, the life-time of the second sample being longer than the life-time of the first sample.

9 Claims, 7 Drawing Sheets

SAMPLING DEVICE FOR A HIGH FREQUENCY ELECTRICAL SIGNAL

TECHNICAL DOMAIN

The invention relates to a device for sampling a high frequency electrical signal and more particularly a device for sampling a very short duration electrical pulse.

Pulse metrology provides a means of describing the variation with time of very short electrical pulses, for example lasting the order of a few tens or a few hundreds of picoseconds.

Pulses of this type are usually output from very fast radiation detectors that convert the energy of a radiation pulse that they receive, for example an X-radiation, gamma, visible or infrared radiation pulse into an electrical pulse. This type of radiation may be emitted by ultra fast radiation sources such as lasers or synchrotron radiation sources. They may also be the result of a laser—material interaction caused by an ultra fast laser (in other words a laser for which the pulse duration is in the range of a picosecond or a femtosecond).

The invention may also be applicable to any measurement of a very short electrical signal, particularly non-repetitive and particularly in event physics, or in the measurement of events generated by phenomena with a duration of the order of a picosecond.

STATE OF THE ART

Sampling oscilloscopes are already known for measuring signals with a spectrum ranging for example up to 50 GHz or 70 GHz. These instruments are capable of measuring repetitive pulses. The sampling frequency is variable from 250 kHz to 1 GHz.

Known transient analyzers are capable of measuring single pulses and, for example, can restore spectra ranging up to 5 GHz or 7 GHz.

The function of transient analyzers is to record very fast single-pulse signals as used in lasers, or in the nuclear, radar or telecommunications fields. These single-pulse signals have a very short duration and a very wide range.

Transient analyzers are composed of a fast sensor, a storage memory and an analogue/digital converter. Successive generations of analyzer have used different principles for performing functions to discretize the analogue signal, that are necessary both in time and on the signal amplitude. Fast writing cathode ray tubes were used firstly to capture and store information quickly. The information thus captured and stored is then discretized in time, and in amplitude and is then digitized. A more recent generation of analyzers sequentially stores analogue or digitized samples, for example using the combination of a flash converter and a fast memory. The sampling frequency determines the time interval allocated to the system to capture, digitize and store the information.

Laboratory prototypes also include the device described in patent U.S. Pat. No. 5,471,162. This type of device depends on the principle of spatial sampling of a pulse. A pulse is propagated on a propagation line. The result is spatial equivalence of the variation with time of this pulse that is propagated on the line with a speed dependent on the physical characteristics of the line. At a given moment, if the line is sufficiently long, the entire pulse is distributed in space along the line.

If samplers are arranged along the propagation line, activating them simultaneously provides a means of making a complete sampling of the pulse, with a time step equal to the distance between the samplers divided by the propagation velocity.

An opto-sampler device is also known that measures pass band signals up to 35 GHz. This device is illustrated in FIG. 1. It comprises a propagation line 1 along which a pulse signal 2 to be measured is propagated. Sampling gates 3 made of photo conducting material (CdTe) are placed at regular intervals along the propagation line. These sampling gates are associated with sampling lines 4, each being followed by a means of reading the charges. The complete set of charge reading means is contained in a charge reading device 5. These charge reading means are connected to a computer 6 programmed to measure charges relative to each channel and to analyse the pulse signal 2. The sampling gates 3 are closed by a trigger light pulse 7 that is distributed on all of the sampling gates. This device thus requires an optical flash with an energy of a few tens of nanojoules and a duration of the order of one picosecond, to trigger sampling.

Document FR-97 06534 describes a single pulse electrical sampler for short pulses. The principle of this sampler is illustrated in FIG. 2.

A structure or line 8 for propagation of electrical pulses comprises several segments 8A, 8B and 8C. The various segments are connected two by two through switches 9 and 10, for example composed of AsGa or Si MESFETs, MOS transistors, or bipole transistors on silicon.

For example, the control means of the switches 9 and 10 include a trigger pulse propagation structure 11, to which the switches 9 and 10 are connected.

Only three line segments 8A, 8B, 8C are shown in FIG. 2, but the line may include an arbitrary number of line segments connected two by two by switches.

A signal to be sampled propagates along the propagation structure or the propagation line 8. A synchronization signal is propagated along the propagation line 11, for example a voltage step marker. The switches are normally conducting and the function of the voltage step is to open the switches. The voltage step can thus be used to isolate each segment in the propagation line, and this segment then acts as a storage capacitor.

The complete set of charges carried by the pulse are then confined in the different segments 8A, 8B and 8C forming the propagation structure of the pulse.

Therefore, the structure illustrated in FIG. 2 comprises:

firstly, a first propagation structure 8, in which the quantity of charges to be measured is propagated, and that is composed of segments connected two by two through initially closed switches, secondly, a second propagation structure 11 in which a voltage step type synchronization signal can be propagated; the voltage step modifies the control of the state of a switch such that it opens and isolates the two segments to which it is connected; the charges trapped in a segment between two switches then being read by an appropriate device.

The device is completed by means of generating a synchronization signal connected to a synchronization pulse propagation structure 11. They may also be connected to a device for reading charges in segments.

These samplers have a limited pass band related to the pass band of the line itself. Furthermore, the detection sensitivity (in other words the quantity of charges sampled in the signal) is also limited. Concerning the opto-sampler, use of a high power picosecond laser imposes very severe experimental constraints and cost constraints.

Finally, all these devices require a very long propagation line that modifies the signal non-uniformly.

The invention does not have the disadvantages mentioned above.

PRESENTATION OF THE INVENTION

The invention relates to a sampling device for a high frequency signal that propagates in a propagation structure. The device comprises a first stage to sample a first signal under the action of a first control signal, at a first time t1 and at least one second stage in series with the first stage to sample a second sample representative of the first sample taken under the action of a second control signal, starting from the first sample taken at a second time t2 greater than t1, the life-time of the second sample in the second stage being very significantly longer than the life-time of the first sample in the first stage.

The invention also relates to a sampling system for a high frequency signal propagating in a propagation structure, characterized in that it comprises at least one sampling device according to the invention.

The invention also relates to a transient analyzer characterized in that it comprises at least one sampling device according to the invention.

The sampling device according to the invention can also advantageously transmit information captured by stage by stage sampling, each stage being slower than the previous stage, until this information is brought into a time environment for which standard processing is possible. For example, standard processing means processing of information within a frequency range of the order of a few tens of megahertz.

BRIEF DESCRIPTION OF THE DRAWINGS

Other characteristics and advantages of the invention will become clear after reading a preferred embodiment of the invention given with reference to the attached figures among which.

The same marks denote the same elements in all figures.

DETAILED DESCRIPTION OF EMBODIMENTS OF THE INVENTION

Figure 1:
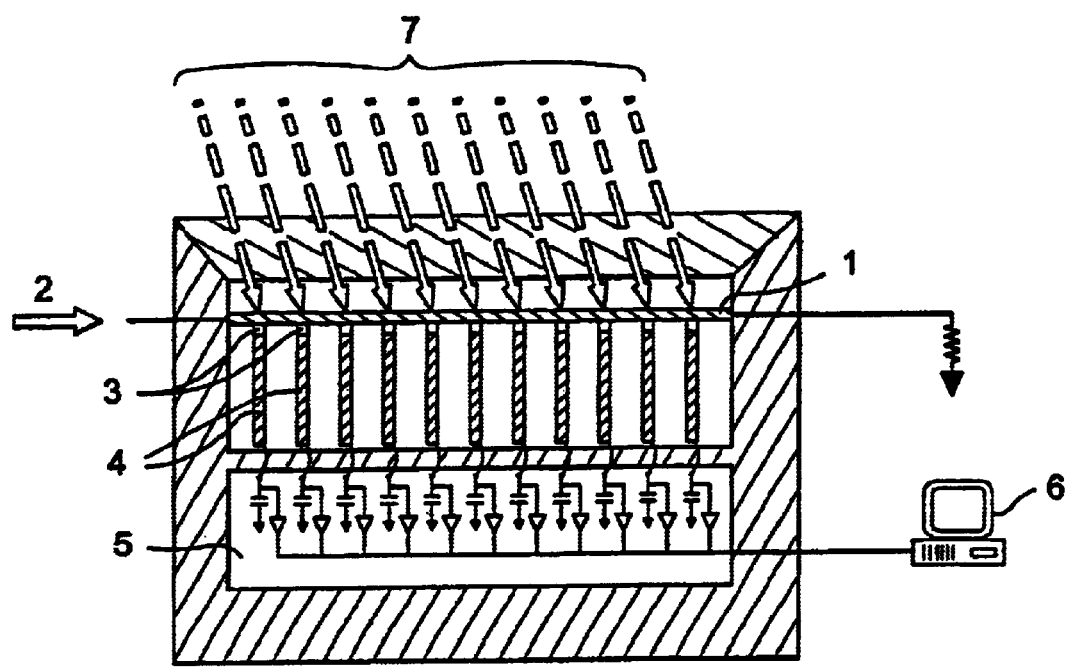
FIGS. 1 and 2 show sampling systems according to prior art.
Figure 2:
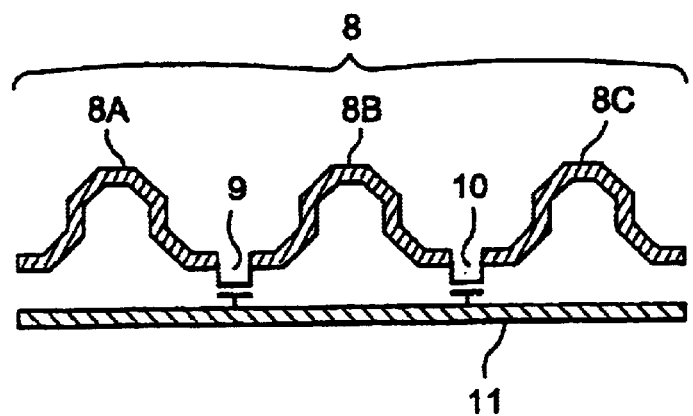

FIGS. 1 and 2 were described above, therefore there is no point in describing them again.

Figure 3:
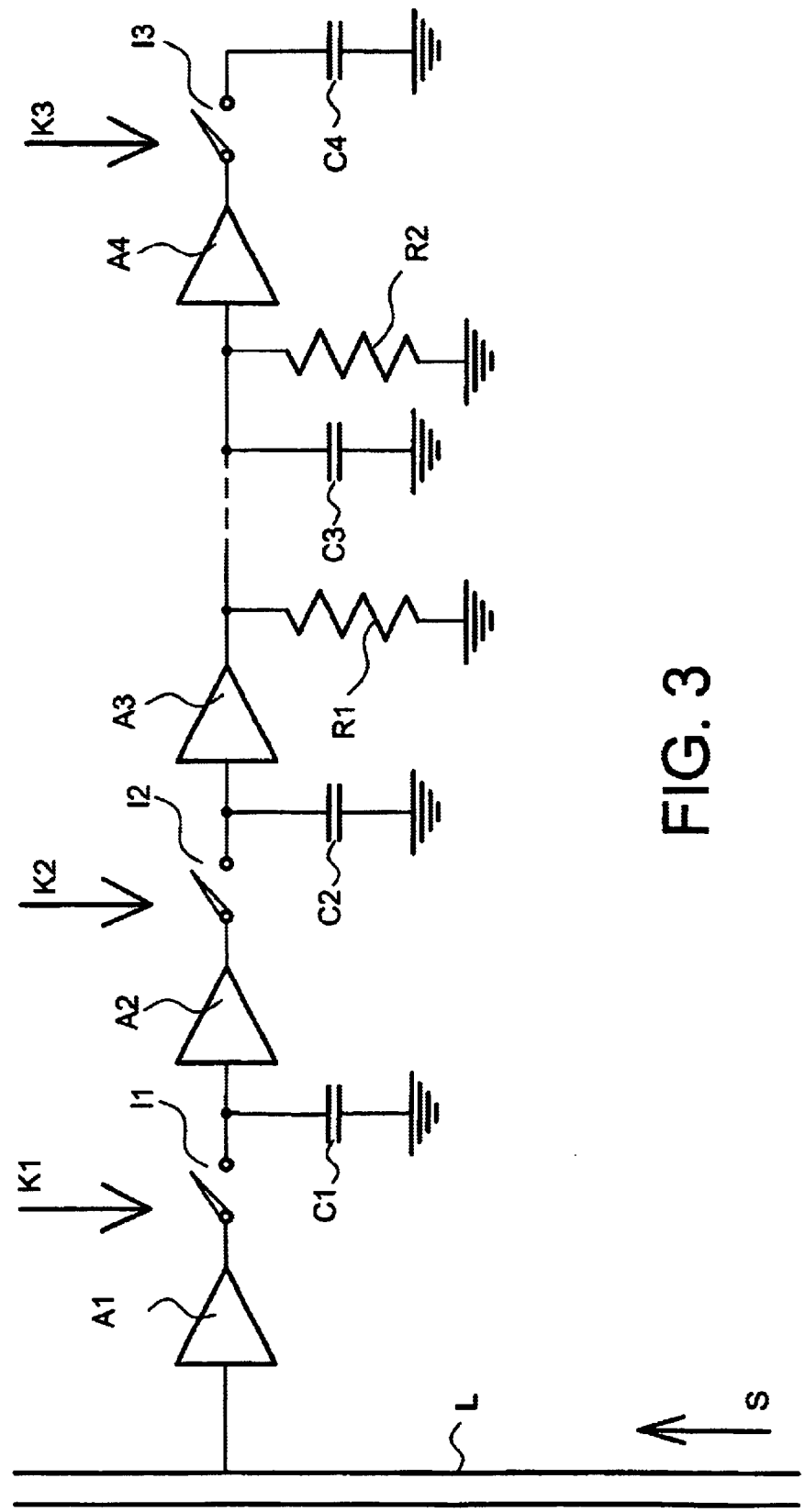
FIG. 3 shows a sampling device according to the invention.

FIG. 3 shows a sampling device according to the invention.

The sampling device comprises at least three elementary stages; a high frequency stage (HF stage), a low frequency stage (LF stage), and an output buffer stage. The HF stage comprises a voltage follower amplifier A1, a switch I1 and a capacitor C1. The LF stage comprises a voltage follower amplifier A2, a switch I2 and a capacitor C2. The output buffer comprises an amplifier A3 and a resistance R1.

The sampling device may also comprise a fourth elementary stage composed of a standard sample and hold circuit comprising a capacitor C3, a resistance R2, an amplifier A4, a switch I3 and a capacitor C4. A sample and hold circuit means a sampling circuit that for example acts at frequencies of the order of a few tens of megahertz.

The various elementary stages are cascaded in series. According to the invention, the fourth stage (standard sample and hold circuit) can advantageously be connected to the third stage through connectors, tracks, lines or more generally any means of setting up a remote connection.

The switches I1, I2 and I3 are controlled by control signals K1, K2 and K3 respectively. A switch Ii (I=1, 2, 3) has a resistance $ri_{on}$ n in the conducting state (switch closed).

The sampling device is connected to the propagation structure, for example a transmission line L. The amplifier A1 is a voltage follower amplifier designed to isolate the line L from impedance variations due to changes to the state of switches.

The purpose of the sampling device is to sample the voltage present on the line L at a given moment. Before sampling, the switches I1 and I2 are closed (conducting state). The charge of the capacitor C1 is then the image of the signal voltage level on the line, at any given moment. When the sampling order is given, the control signal K1 opens the switch I1 so that the switch changes to the non-conducting state. The capacitor C2 in the LF stage is then charged corresponding to the charge of the HF capacitor. The capacitors C1 and C2 are chosen such that capacitor C2 is charged through resistance $r2_{on}$ well before capacitor C1 is discharged through the leakage resistance $r1_{off}$ that appears at the terminals of the capacitor C1 when the switch I1 is open.

The following condition must then be satisfied:

$$r1_{off} \times C1 = F \times r2_{on} \times C2,$$

where F is a multiplication factor very much greater than 1.

According to one non-limitative example embodiment of the invention, the capacitor C1 may be equal to 0.3 pF and the capacitor C2 may be equal to 10 pF. For a resistance $r1_{off}$ equal to 100 kΩ and a resistance $r2_{on}$ equal to 180 Ω, the charge time of capacitor C2 is then equal to 1.8 ns and the discharge time of capacitor C1 is equal to 30 ns. The factor F is then equal to approximately to 16.6.

When the capacitor C2 is charged, the control signal K2 opens the switch I2 that is then put into the non-conducting state. The useful signal is then composed of the charge contained in the capacitor C2. The time between when switch I1 opens and when switch I2 opens is advantageously chosen to obtain an acceptable compromise between the charge time of capacitor C2 and the discharge time of capacitor C1.

The function of the output buffer stage is to copy the voltage state of capacitor C2. The output voltage collected at the terminals of resistance R1 is then representative of the charge contained in the capacitor C2. This output voltage is an intermittent magnitude because capacitor C2 discharges in the leakage resistance $r2_{off}$ that exists at the terminals of the capacitor C2 when the switch I2 is open. For example, the leakage resistance $r2_{off}$ may be equal to 600 kΩ. If the value of the capacitor C2 is equal to 10 pF, the discharge time of the capacitor is then equal to 6 µs. Advantageously, the life-time of the sampled information is very significantly longer than the life-time of the signal sampled by the previous stage. The sampled information can thus be processed by a sample and hold circuit based on a standard technology (C3, R2, A4, I3, C4) using conventional connector technology (connectors, tracks, lines, etc.), well before the capacitor C2 is discharged.

Figure 4:
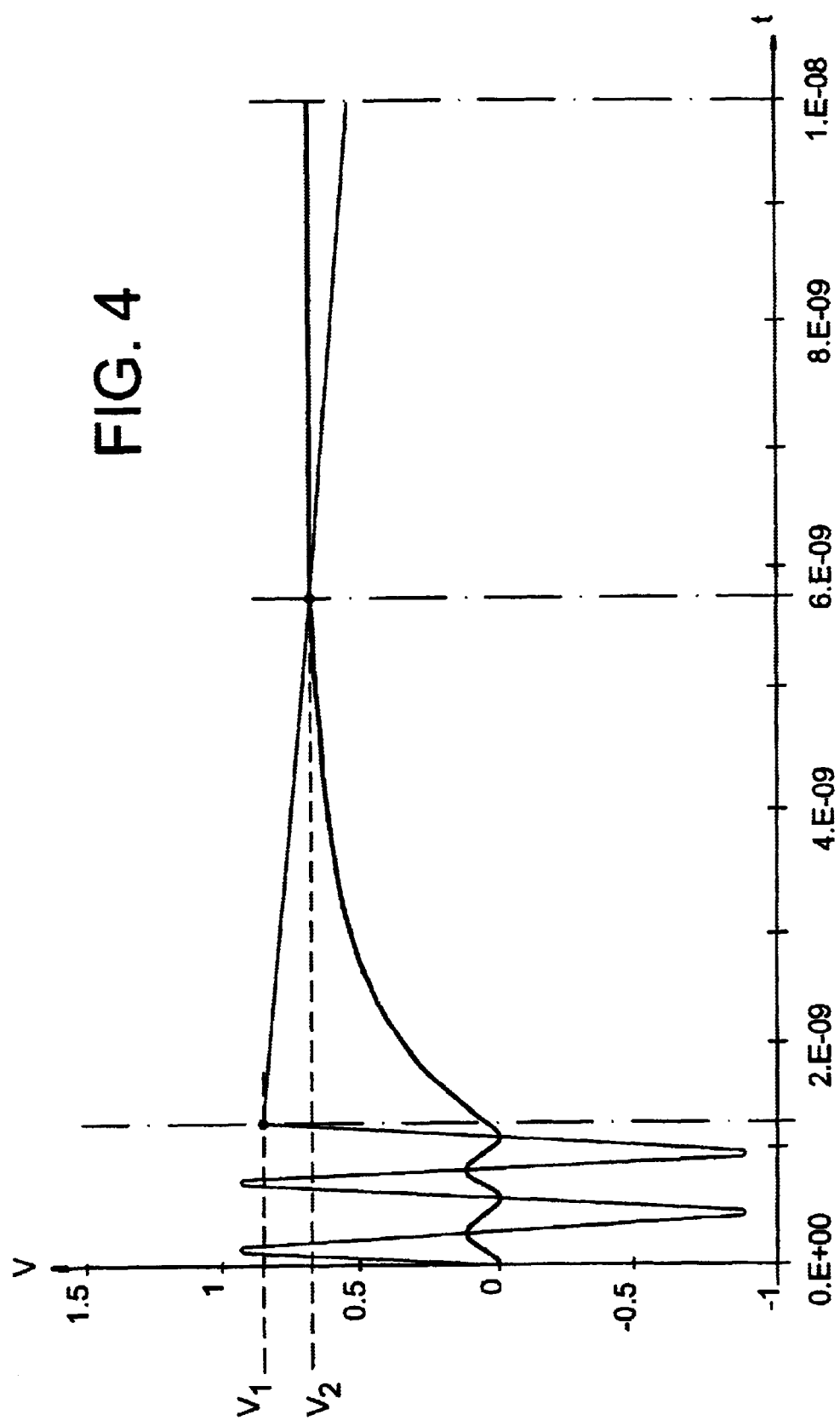
FIG. 4 shows curves illustrating the variation of voltages at different points in a sampling device according to the invention.

FIG. 4 shows the variation of the voltage at the terminals of capacitors C1 and C2 as a function of time. Curve $V_{C1}$ shows the variation of the voltage at the terminals of the capacitor C1, and curve $V_{C2}$ shows the variation of the voltage at the terminals of the capacitor C2.

As a non-limitative example, the signal that propagates on line L is chosen to be sinusoidal. However, the invention relates to any other type of signal, for example such as a pulse signal.

Before sampling, switches I1 and I2 are closed (conducting state). The voltage level at the terminals of capacitor C1 follows the variations of the high frequency signal that propagates on the line L (see the sinusoidal fraction of the curve $V_{C1}$), while the voltage level at the terminals of capacitor C2 does not follow these variations (bandwidth too narrow). At the time of sampling t1, switch I1 opens under the action of the command K1. The voltage $V_1$ is measured at the terminals of capacitor C1, and C1 then discharges progressively through resistance $r1_{off}$. At the same time, the capacitor C2 charges until the voltage at its terminals is equal to the voltage at the terminals of capacitor C1. Under the action of the command K2, switch I2 changes from the conducting state to the non-conducting state at time t2. As shown in FIG. 4, time t2 is preferably the time at which the voltages at the terminals of capacitors C1 and C2 are equal to approximately the same voltage $V_2$. The capacitor C2 at the terminals of which the voltage $V_2$ is measured then discharges progressively through the leakage resistance $r2_{off}$. As mentioned above, the discharge time constant for capacitor C2 is very much greater than the discharge time constant for capacitor C1. Sampling information at the terminals of the capacitor C2 is kept for a long enough time period so that it can be processed by circuits based on a standard technology. As a non-limitative example, times t1 and t2 are chosen such that the time t2 −t1 is between 5 ns and 10 ns.

According to the embodiment of the invention described above, two sampling stages (an HF stage and an LF stage) are used to obtain sampled information that can be processed by conventional circuits. The invention also relates to the case in which more than two sampling stages are used to obtain this information. However, each additional sampling stage adds a noise level to the measurement obtained. In general, the choice of the number of sampling stages is then dependent on the following parameters:

the maximum frequency of the signal to be sampled (for example, this frequency may be as high as 8 GHz or more), the frequency of signals that it is considered can be processed by conventional circuits, the required output range for the entire sampling function (this range depends partly on the technology available for the switches ($r_{off}/r_{on}$ ratio depending on the frequency) and the noise added by each stage).

Figure 5:
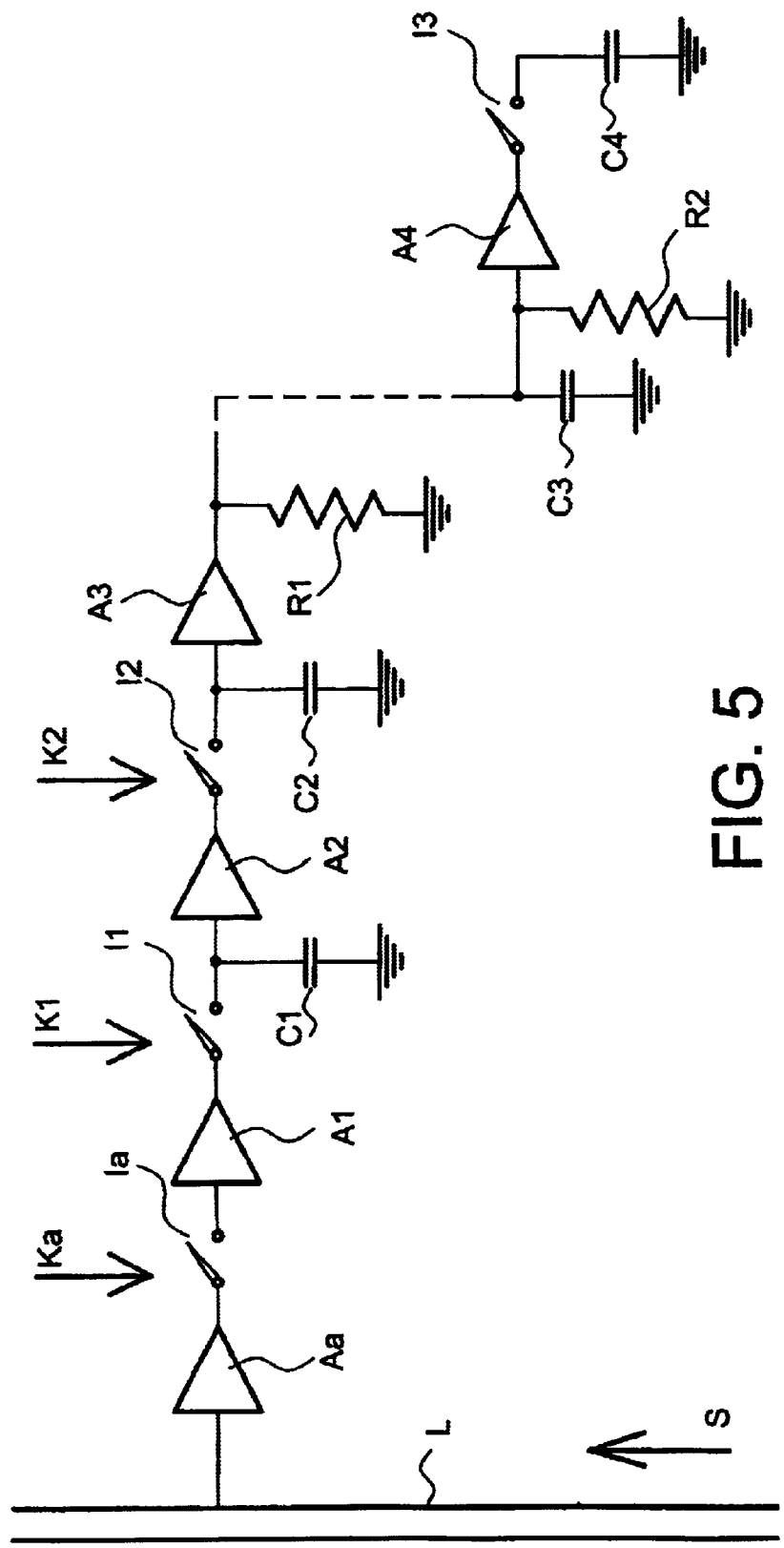
FIG. 5 shows an improvement to the sampling device shown in FIG. 3.

FIG. 5 shows an improvement to the sampling device according to the invention shown in FIG. 3.

In addition to the elements shown in FIG. 3, the sampling device according to the improvement to the invention comprises an amplifier Aa and a switch Ia. The amplifier Aa and the switch Ia are installed in series between the propagation line L and the input to the amplifier A1. Preferably, the characteristics of the amplifier Aa and the switch Ia are approximately identical to the characteristics of the amplifier A1 and the switch I1 respectively. A control signal Ka controls the switch Ia.

The assembly formed by the amplifier Aa and the switch Ia advantageously increases the impedance insulation between the line L and the circuits on the input side of the amplifier A1, while maintaining the bandwidth and the switching speed of switches I1 and I2. In the same way as above, the switch I1 performs the sampling function. Thus, switch I1 is switched quickly, at exactly the sampling time.

The switch Ia is switched significantly after I1 and with fewer constraints than I1, in terms of the duration and the switching time. The function of the switch Ia is to isolate the switch I1 from the signal present on the line during the period while the switch I2 is still conducting. Constraints related to the switch Ia are relative essentially to its bandwidth in the conducting state. Its presence effectively doubles the resistance $r1_{off}$ without doubling the resistance $r1_{on}$.

Figure 6:
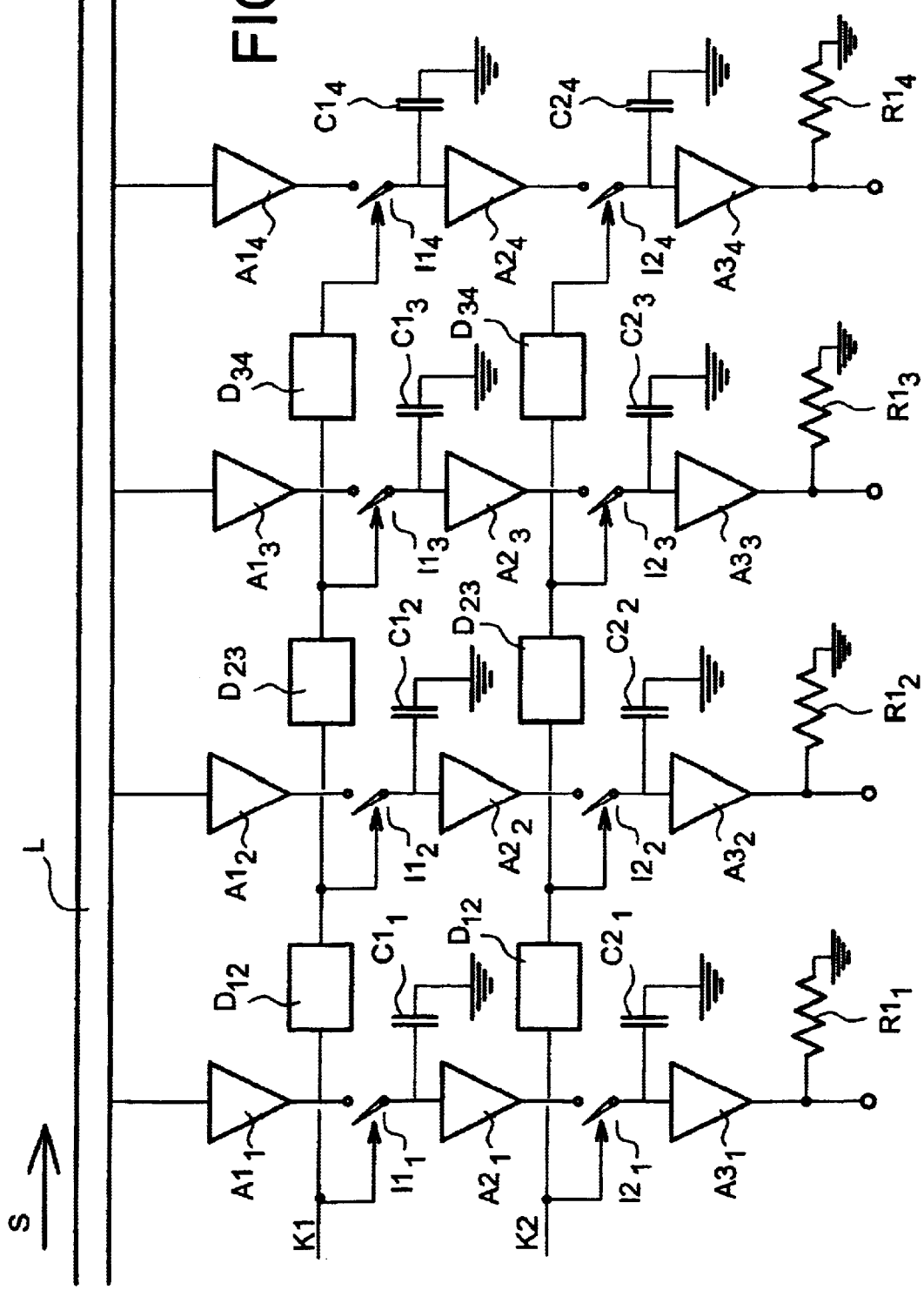
FIG. 6 shows a principle diagram for the sampling system according to the invention.

FIG. 6 shows an example of a sampling system composed of four successive sampling devices distributed in parallel along a line L. The rank i sampling device (i=1, 2, 3, 4) comprises an HF stage ($A1_i$, $I1_i$, $C1_i$), an LF stage ($A2_i$, $I2_i$, $C2_i$) and a buffer stage ($A3_i$, $R1_i$).

The sampling control signal is transmitted from gate to gate with a time lag chosen to make a sampling time step. A time lag $D_{k,k+1}$ is thus provided to delay the control signals K1 and K2 between the rank k sampling device and the rank k+1 sampling device. Advantageously, samples taken at the output from the sampling devices according to the invention are processed in parallel and simultaneously.

Figure 7:
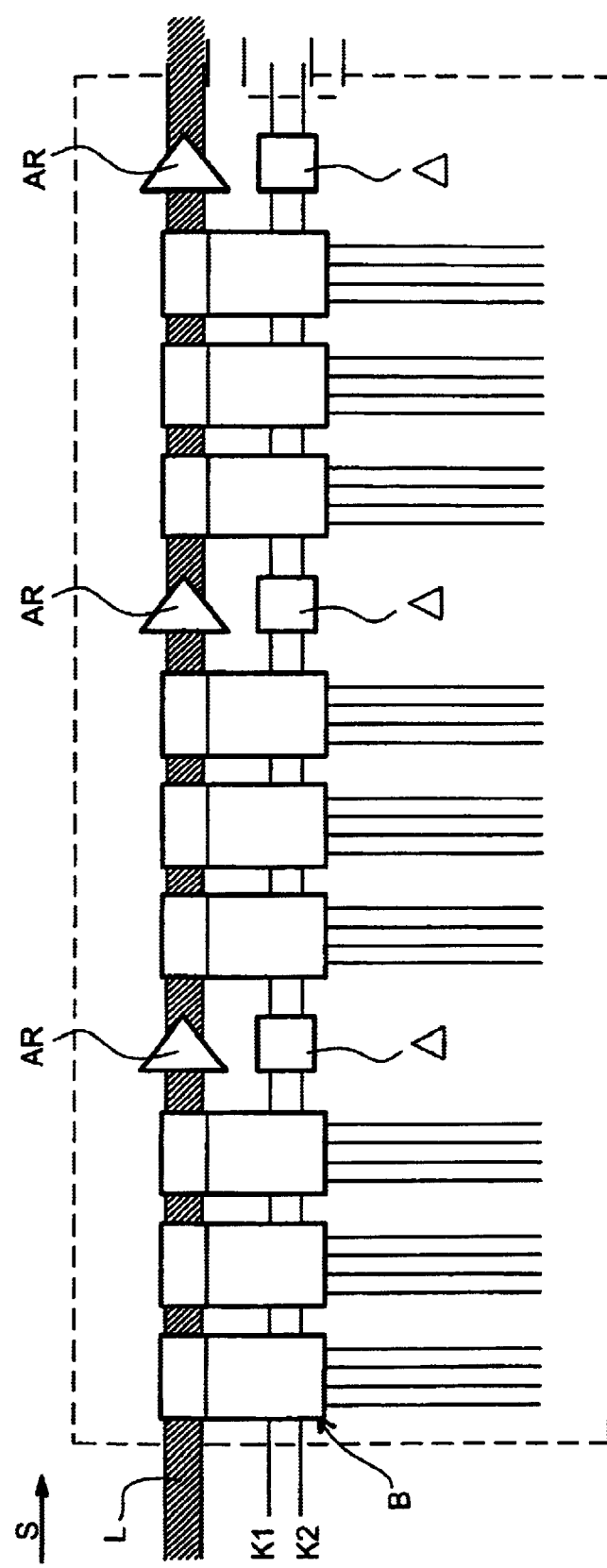
FIG. 7 shows an example embodiment of the sampling system as shown in FIG. 6.

FIG. 7 shows an embodiment of the sampling system shown in FIG. 6.

Sampling devices are grouped in blocks. Each block B may for example comprise four sampling devices. Amplifiers AR are inserted in the line L, in order to compensate for attenuation of the signal S during the propagation.

An amplifier AR is designed to have dual amplification characteristics of the attenuation characteristics of the line segment separating it from the amplifier preceding it, as a function of the frequency. Let $G_L$ be the gain of the line element between two nearby elementary sampling devices, let $G_{AR}$ be the gain of an amplifier AR, N the number of elementary sampling devices between two amplifiers AR, and the following relation is then true:

$$(N \times G_L) \times G_{AR} = 1,$$

for all frequencies in the band considered.

Each amplifier AR has a specific noise that deteriorates the signal. The number N is then preferably chosen so as to optimize the signal/noise ratio. A study of the propagation of the signal made in parallel with a noise study has determined that the number N=12 gives the best performances in terms of the signal/noise ratio.

In the example chosen, sampling devices are grouped in blocks of four. As shown as a non-limitative example in FIG. 7, it follows that three blocks of sampling devices are placed between two successive amplifiers AR in order to optimize the signal/noise ratio.

Insertion of an amplifier in the propagation line L imposes a delay on the signal when the signal passes through the amplifier. It is then necessary to insert an equivalent delay in propagation of the sampling control signals, in order to keep the sampling time step constant with respect to the signal. This is why a delay circuit Δ imposes a delay on the control signals K1 and K2.

As mentioned above, according to the invention samples taken at the output from the different sampling devices are processed in parallel and simultaneously.

Figure 8:
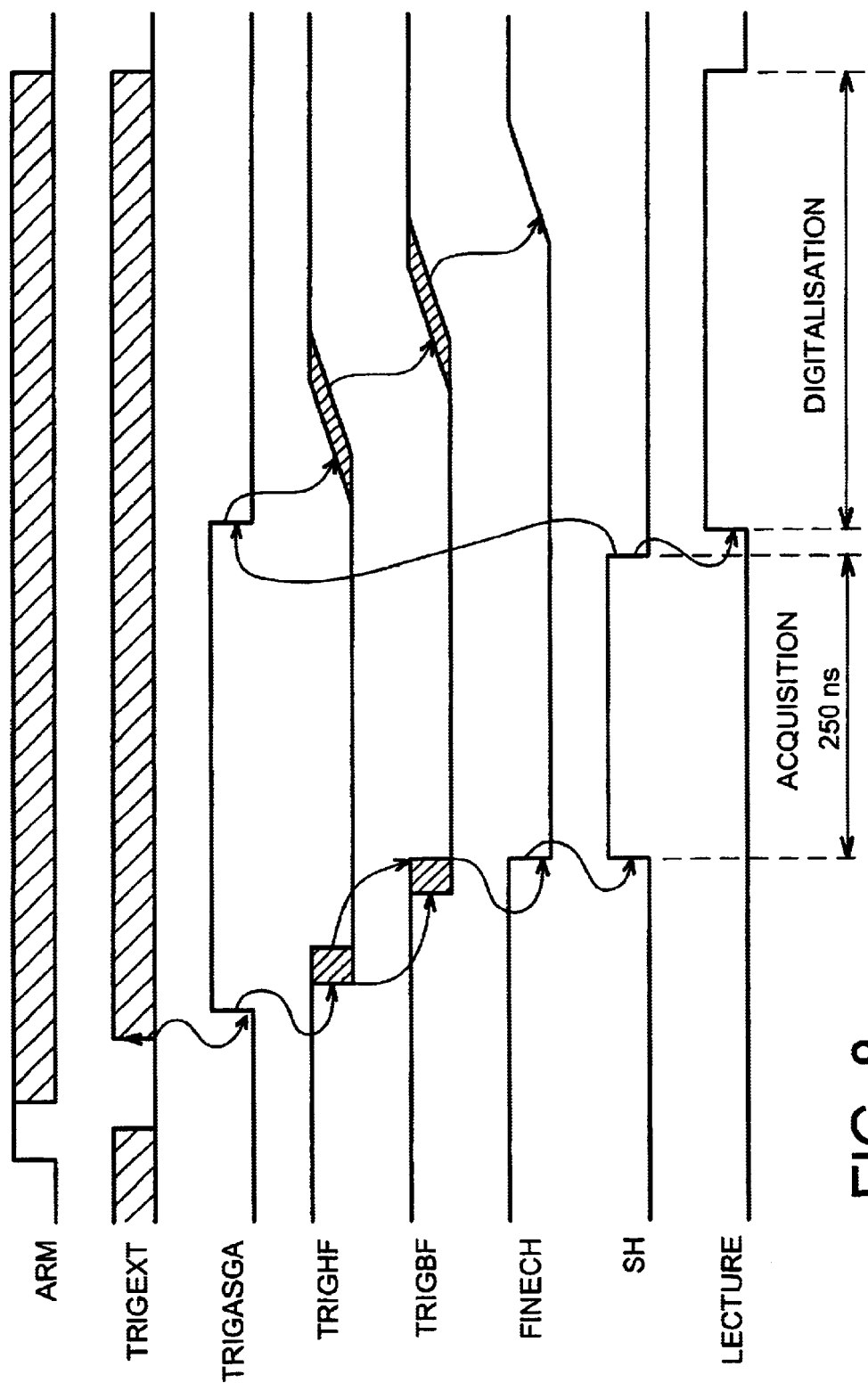
FIG. 8 shows dialogue and switching signal time diagrams used to perform a sampling sequence according to the invention.

FIG. 8 shows how dialogue and switching signals used for a sampling sequence are chained.

The curves in FIG. 8 essentially represent sampling signals and dialogue signals between a sample measurement system and a sampler module according to the invention.

When an "ARM" signal is in the high state, the acceptance of the rising front of a trigger pulse "TRIGEXT" is validated to acquire samples. This trigger pulse rising front is shaped before it is sent to the sampler module (see "TRIGASGA" signal). In the sampler module, the shaped signal "TRIGASGA" generates the "TRIGHF" signal that is propagated in the various HF stages to generate control signals K1. The "TRIGASGA" signal then generates the "TRIGBF" signal (a few nanoseconds later) that propagates in the different LF stages to generate the control signals K2. After the final sampler, the "TRIGBF" signal (reference "FINECH" in FIG. 8) is sent to the read system to notify that all samples are available at the output from the module.

The read system then uses an "SH" signal to initialize an acquisition phase in the sample and hold circuits during a period of for example 250 ns (characteristic of the chosen circuit). This phase is asynchronous, triggered by the falling front of the "FINECH" signal, such that the discharge states of the capacitors C2 can be reproduced from one acquisition to the next.

At the end of this phase, the "TRIGASGA" signal is invalidated, which causes all switches I1 and I2 inside the sampler module to change one by one to the conducting state.

At the same time, a sequential read and digitization phase is initialized at a clock frequency of a few megahertz. When this phase is finished, the system enables acceptance of a new acquisition request by the "ARM" signal.

What is claimed is:

1. Sampling device for a high frequency signal (S) that propagates in a propagation structure (L), comprising:

a first stage (A1, I1, C1) to take a first signal sample under the action of a first control signal (K1) at a first time t1 and at least one second stage (A2, I2, C2) in series with the first stage to sample a second sample representative of the first sample taken under the action of a second control signal (K2), starting from the first sample taken at a second time t2 greater than t1, the life-time of the second sample in the second stage (A2, I2, C2) being very significantly longer than the life-time of the first sample in the first stage (A1, I1, C1), wherein:

the first stage (A1, I1, C1) comprises a first voltage follower amplifier (A1) connected to the propagation structure (L), a first switch (I1) and a first capacitor (C1), the first switch (I1) being controlled by the first control signal (K1) so as to switch from the conducting state to the non-conducting state at the first time t1, such that the first capacitor (C1) discharges in a resistance $r1_{off}$ at times t>t1, the second stage comprises a second voltage follower amplifier (A2), a second switch (I2) and a second capacitor (C2), the second switch (I2) being in the conducting state at first time t1 such that the capacitor C2 is charged through resistance $r2_{on}$ of the second switch (I2) in the conducting state at times t>t1, the second switch (I2) being controlled by the second control signal (K2) so as to switch from the conducting state to the non-conducting state at the second time t2, the following condition then being satisfied:

$$r1_{off} \times C1 F \times r2_{on} \times C2, \text{ where}$$

F is a multiplication factor very much greater than 1.

2. Sampling device according to claim 1, characterized in that the first voltage follower amplifier (A1) is connected to the propagation structure (L) through an amplifier (Aa) mounted in series with a switch (Ia) controlled by a control signal (Ka), to increase the impedance insulation between the propagation structure and the circuits on the input side of the first voltage follower amplifier (A1).

3. Device according to claim 1, characterized in that the time t2 is the time at which the voltage at the terminals of the capacitor C2 is approximately equal to the voltage at the terminals of the capacitor C1.

4. Device according to claim 1, characterized in that it comprises an output buffer (A3, R1) to copy the voltage state at the terminals of the second stage.

5. Device according to claim 4, characterized in that it comprises a sample and hold circuit (C3, R2, A4, I3) to sample the signal taken at the output from the output buffer stage (A3, R1).

6. Sampling system for a high frequency signal propagating in a propagation structure, characterized in that it comprises at least one sampling device according to claim 1 including means to take a signal sample.

7. Sampling system according to claim 6, characterized in that it comprises:

a sequence of amplifiers (AR) placed in series in the propagation structure,

N sampling devices in parallel that take N signal samples on a line segment between two successive amplifiers, and a set of delay circuits (Δ), each delay circuit (Δ) delaying the first and second control signals (K1, K2) by a duration approximately equal to the duration taken by a signal to pass through an amplifier (AR).

8. Sampling system according to claim 7, characterized in that N=12.

9. Sampling device according to claim 1 for use as a transient analyzer.

* * * * *